United States Patent
Camacho et al.

(10) Patent No.: US 9,922,955 B2
(45) Date of Patent: Mar. 20, 2018

(54) SEMICONDUCTOR DEVICE AND METHOD OF FORMING PACKAGE-ON-PACKAGE STRUCTURE ELECTRICALLY INTERCONNECTED THROUGH TSV IN WLCSP

(75) Inventors: Zigmund R. Camacho, Singapore (SG); Dioscoro A. Merilo, Singapore (SG); Lionel Chien Hui Tay, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 1338 days.

(21) Appl. No.: 12/717,335

(22) Filed: Mar. 4, 2010

(65) Prior Publication Data

US 2011/0215458 A1 Sep. 8, 2011

(51) Int. Cl.
*H01L 25/065* (2006.01)
*H01L 21/48* (2006.01)
(Continued)

(52) U.S. Cl.
CPC ...... *H01L 25/0657* (2013.01); *H01L 21/4853* (2013.01); *H01L 23/49816* (2013.01); *H01L 23/52* (2013.01); *H01L 24/96* (2013.01); *H01L 24/73* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/48472* (2013.01); *H01L 2224/73204* (2013.01); *H01L 2224/73265* (2013.01); *H01L 2924/01322* (2013.01); *H01L 2924/13091* (2013.01); *H01L 2924/14* (2013.01); *H01L 2924/15311* (2013.01);
(Continued)

(58) Field of Classification Search
USPC ............................ 257/686, 777, 778; 438/108
See application file for complete search history.

(56) References Cited

U.S. PATENT DOCUMENTS

| | | | | |
|---|---|---|---|---|
| 6,225,699 B1 * | 5/2001 | Ference et al. | | 257/777 |
| 7,372,151 B1 * | 5/2008 | Fan | | H01L 21/561 |
| | | | | 257/738 |

(Continued)

*Primary Examiner* — Zandra Smith
*Assistant Examiner* — Abbigale Boyle
(74) *Attorney, Agent, or Firm* — Robert D. Atkins; Patent Law Group: Atkins and Associates, P.C.

(57) ABSTRACT

A semiconductor wafer has a plurality of semiconductor die. First and second conductive layers are formed over opposing surfaces of the semiconductor die, respectively. Each semiconductor die constitutes a WLCSP. A TSV is formed through the WLCSP. A semiconductor component is mounted to the WLCSP. The first semiconductor component is electrically connected to the first conductive layer. A first bump is formed over the first conductive layer, and a second bump is formed over the second conductive layer. An encapsulant is deposited over the first bump and first semiconductor component. A second semiconductor component is mounted to the first bump. The second semiconductor component is electrically connected to the first semiconductor component and WLCSP through the first bump and TSV. A third semiconductor component is mounted to the first semiconductor component, and a fourth semiconductor component is mounted to the third semiconductor component.

17 Claims, 8 Drawing Sheets

(51) Int. Cl.
*H01L 23/498* (2006.01)
*H01L 23/00* (2006.01)
*H01L 23/52* (2006.01)

(52) U.S. Cl.
CPC ............... *H01L 2924/15331* (2013.01); *H01L 2924/18161* (2013.01)

(56) References Cited

U.S. PATENT DOCUMENTS

| | | | |
|---|---|---|---|
| 7,553,752 B2* | 6/2009 | Kuan et al. | 438/613 |
| 7,608,921 B2* | 10/2009 | Pendse | 257/686 |
| 7,667,313 B2* | 2/2010 | Kawabata et al. | 257/686 |
| 7,795,717 B2* | 9/2010 | Goller | H01L 23/5389 257/685 |
| 8,012,797 B2* | 9/2011 | Shen et al. | 438/107 |
| 2001/0028114 A1* | 10/2001 | Hosomi | 257/778 |
| 2001/0038151 A1* | 11/2001 | Takahashi | H01L 23/3107 257/778 |
| 2006/0157832 A1* | 7/2006 | Ryu | H01L 23/5389 257/678 |
| 2008/0017968 A1* | 1/2008 | Choi | H01L 21/565 257/686 |
| 2008/0258289 A1* | 10/2008 | Pendse et al. | 257/690 |
| 2008/0272477 A1 | 11/2008 | Do et al. | |
| 2009/0072375 A1* | 3/2009 | Song et al. | 257/686 |
| 2009/0166825 A1 | 7/2009 | Camacho et al. | |

* cited by examiner

SEMICONDUCTOR DEVICE AND METHOD OF FORMING PACKAGE-ON-PACKAGE STRUCTURE ELECTRICALLY INTERCONNECTED THROUGH TSV IN WLCSP

FIELD OF THE INVENTION

The present invention relates in general to semiconductor devices and, more particularly, to a PoP structure electrically interconnected through TSV formed in a WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a wafer level chip scale package (WLCSP) containing semiconductor devices on multiple levels (3-D device integration) and external devices can be accomplished with conductive through silicon vias (TSV) or through hole vias (THV). In most TSVs and THVs, the sidewalls and bottom-side of the via are conformally plated with conductive materials to enhance adhesion. The TSVs and THVs are then filled with another conductive material, for example, by copper deposition through an electroplating process.

In a package-on-package (PoP) arrangement, the vertical z-direction interconnection may use a TSV interposer and solder bump on a wire bond die. However, the device integration is complex and package laminate increases production costs.

SUMMARY OF THE INVENTION

A need exists for PoP vertical integration compatible with WLCSPs. Accordingly, in one embodiment, the present invention is a method of making a semiconductor device comprising the steps of providing a semiconductor wafer having a plurality of semiconductor die, and forming first and second conductive layers over first and second opposing surfaces of the semiconductor die, respectively. Each semiconductor die constitutes a WLCSP. The method further includes the steps of forming a TSV through the WLCSP, mounting a first semiconductor component to the WLCSP, electrically connecting the first semiconductor component to the first conductive layer, forming a first bump over the first conductive layer, and mounting a second semiconductor component to the first bump. The second semiconductor component is electrically connected to the first semiconductor component and WLCSP through the first bump and TSV. The method further includes singulating the semiconductor wafer.

In another embodiment, the present invention is a method of making a semiconductor device comprising the steps of providing a semiconductor wafer having a plurality of semiconductor die, and forming a first conductive layer over a first surface of the semiconductor die. Each semiconductor die constitutes a WLCSP. The method further includes the steps of forming a TSV through the WLCSP, mounting a first semiconductor component to the WLCSP, forming a first interconnect structure over the first conductive layer, and mounting a second semiconductor component to the first interconnect structure. The second semiconductor component is electrically connected to the first semiconductor component and WLCSP through the first interconnect structure and TSV.

In another embodiment, the present invention is a method of making a semiconductor device comprising the steps of providing a WLCSP having a first conductive layer formed over a first surface of the WLCSP, forming a TSV through the WLCSP, mounting a first semiconductor component to the WLCSP, forming a first interconnect structure over the first conductive layer, and mounting a second semiconductor component to the first interconnect structure. The second semiconductor component is electrically connected to the first semiconductor component and WLCSP through the first interconnect structure and TSV.

In another embodiment, the present invention is a semiconductor device comprising a WLCSP having a first conductive layer formed over a first surface of the WLCSP. A TSV is formed through the WLCSP. A first semiconductor component is mounted to the WLCSP. A first interconnect structure is formed over the first conductive layer. A second semiconductor component is mounted to the first interconnect structure. The second semiconductor component is electrically connected to the first semiconductor component and WLCSP through the first interconnect structure and TSV.

DETAILED DESCRIPTION OF THE DRAWINGS

Figure 1:
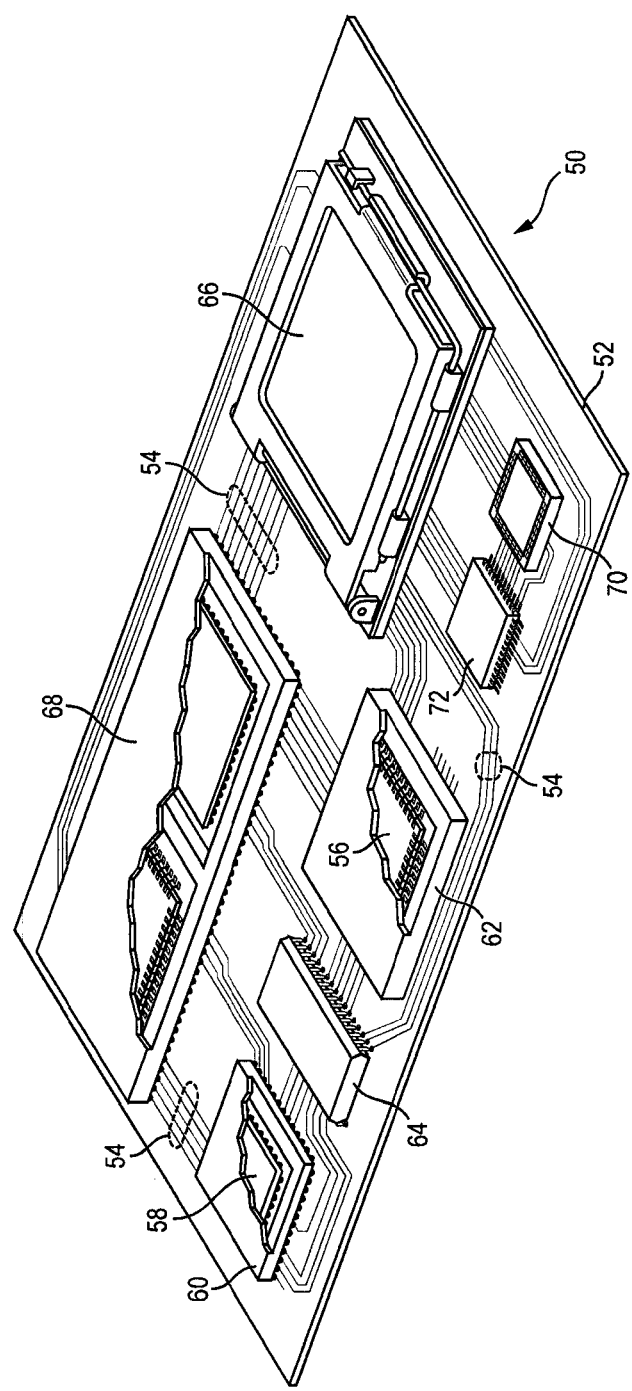
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping, arranged as necessary, to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
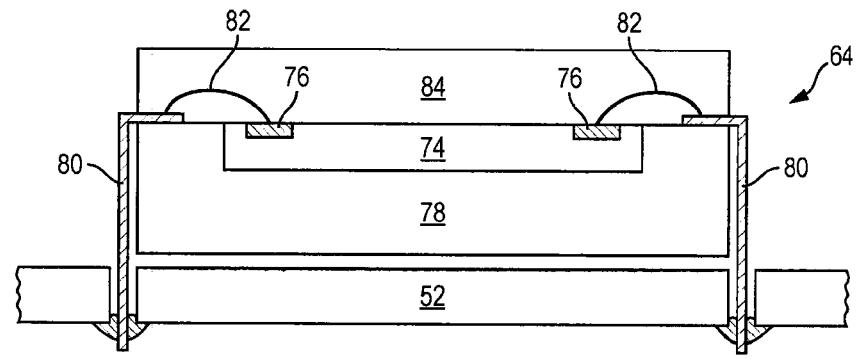
FIGS. 2a-2c illustrate further detail of the representative semiconductor packages mounted to the PCB.
Figure 2B:
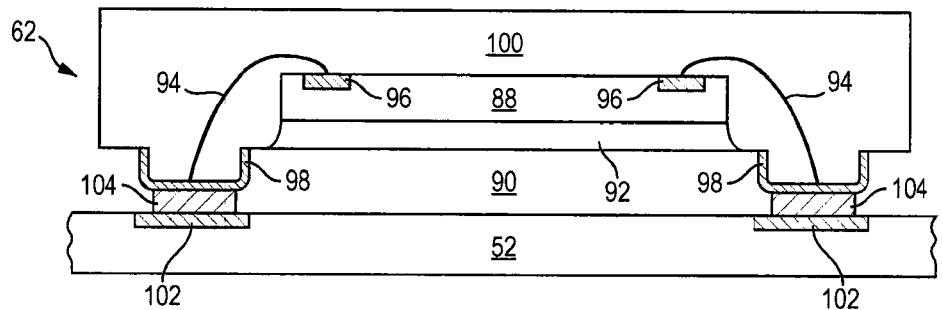
Figure 2C:
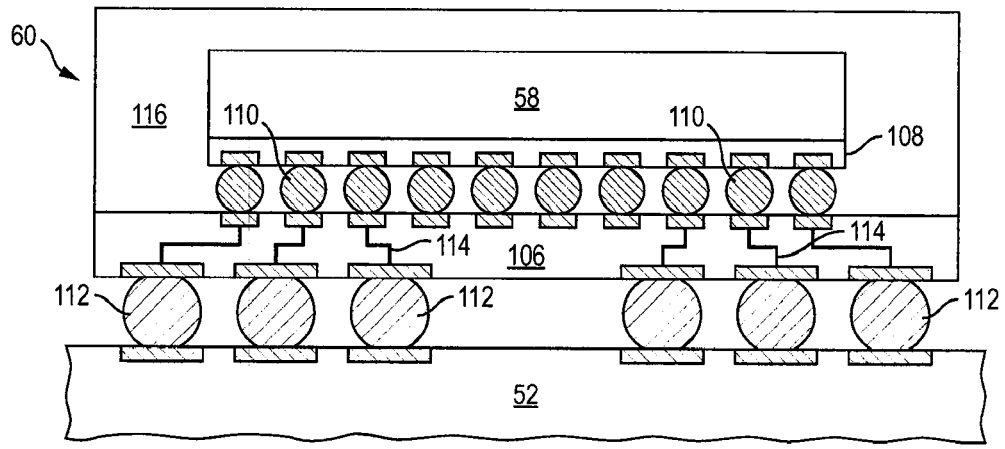

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
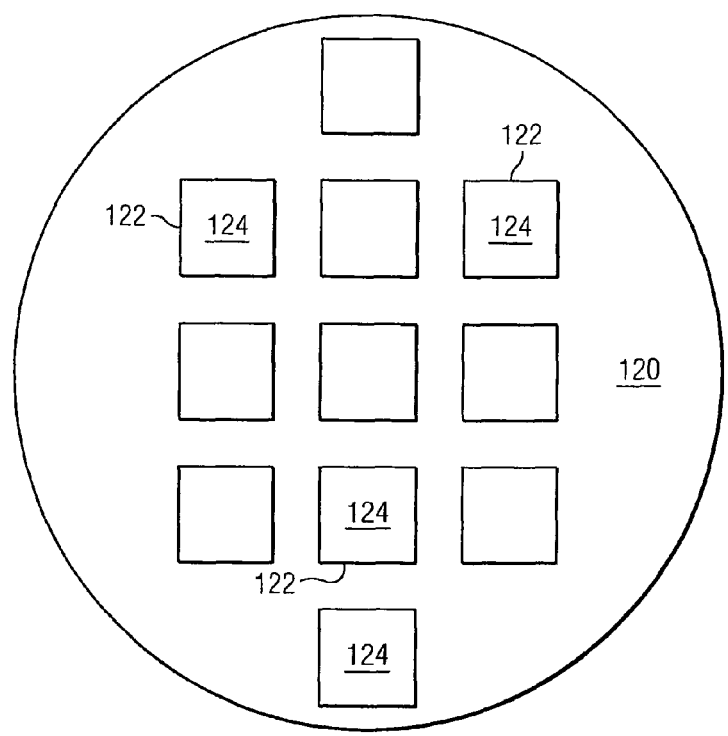
FIGS. 3a-3f illustrate a process of forming a conductive TSV through a WLCSP and electrically interconnecting a PoP structure through the TSV.

FIGS. 3a-3f illustrate, in relation to FIGS. 1 and 2a-2c, a process of forming a conductive TSV through a WLCSP and vertically stacking semiconductor packages over the WLCSP which are electrically interconnected through the TSV. FIG. 3a shows a semiconductor wafer 120 containing a base substrate material such as silicon, germanium, gallium arsenide, indium phosphide, or silicon carbide, for structural support. A plurality of semiconductor die 122 is formed on wafer 120 as described above. Each semiconductor die 122 includes an active surface 124 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 124 to implement analog circuits or digital circuits, such as digital signal processor (DSP), ASIC, memory, or other signal processing circuit. Semiconductor die 122 may also contain IPDS, such as inductors, capacitors, and resistors, for RF signal processing.

In the WLCSP, the interconnect structure is formed on the semiconductor wafer prior to singulation. Once singulated, the WLCSP is ready for mounting to other devices and structures, for example, using surface mount technology (SMT) to a PCB. The WLCSP is a chip-size product and provides the relative low cost of wafer-level processing.

Figure 3B:
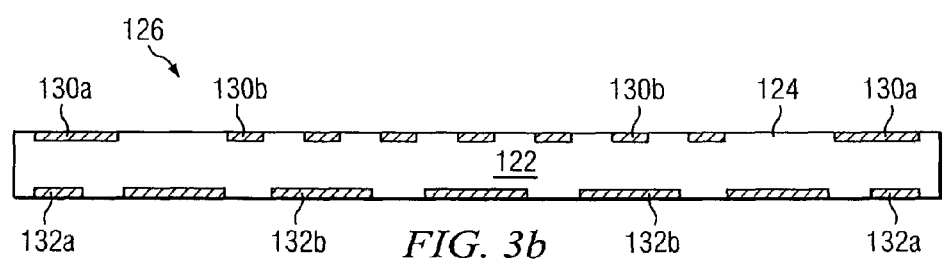

FIG. 3*b* shows a cross-sectional view of one die 122 of semiconductor wafer 120, prior to singulation. An electrically conductive layer 130 is formed over the top active surface of semiconductor die 122 using patterning with PVD, CVD, sputtering, electrolytic plating, electroless plating process, or other suitable metal deposition process to form individual portions or sections 130*a*-130*b*. Likewise, an electrically conductive layer 132 is formed over the bottom surface of semiconductor die 122, opposite active surface 124, using patterning with PVD, CVD, sputtering, electrolytic plating, electroless plating process, or other suitable metal deposition process to form individual portions or sections 132*a*-132*b*. Conductive layers 130 and 132 can be one or more layers of Al, Cu, Sn, Ni, Au, Ag, or other suitable electrically conductive material. The portions of conductive layers 130 and 132 can be electrically common or electrically isolated depending on the design and function of the semiconductor device. The interconnect structure 130-132 formed over semiconductor die 122 constitute the beginning stage of forming WLCSP 126.

In one embodiment, conductive layers 130 and 132 are under bump metallization (UBM) layers made with multimetal stack including an adhesion layer, barrier layer, and seed or wetting layer. The adhesion layer can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into semiconductor die 122. The seed layer can be Cu, Ni, NiV, Au, or Al. The seed layer is formed over the barrier layer. UBM 130-132 provides a low resistive interconnect, as well as a barrier to solder diffusion and seed layer for solder wettability.

Figure 3C:
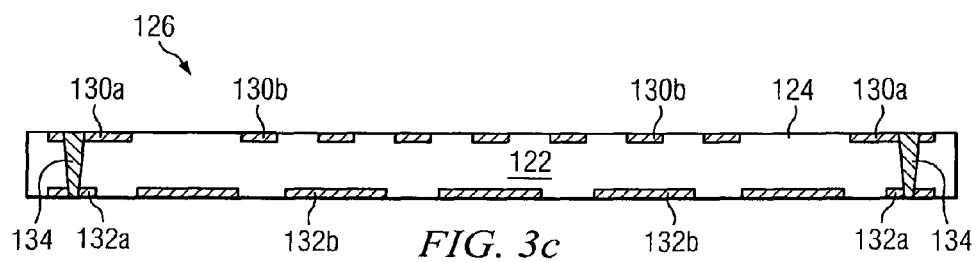

In FIG. 3*c*, a plurality of vias is formed through semiconductor wafer 120 using deep reactive ion etching (DRIE), laser drilling, or mechanical drilling process. The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive TSV 134. Conductive layers 130 and 132 are electrically connected by TSV 134.

Figure 3D:
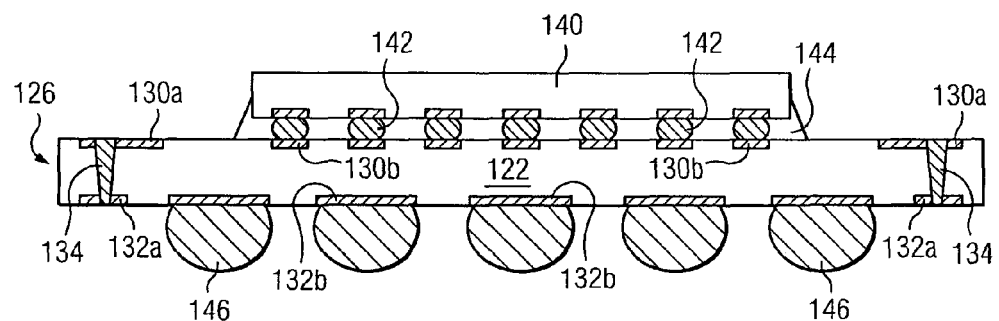

In FIG. 3*d*, a semiconductor die or package 140 is mounted to the top surface of WLCSP 126 in a flipchip arrangement with bumps 142 electrically connected to conductive layer 130*b*. Semiconductor die 140 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 140 may also contain IPDS, such as inductors, capacitors, and resistors, for RF signal processing. An underfill material 144, such as epoxy resin, is deposited under semiconductor die 140.

An electrically conductive bump material is deposited over conductive layer 132*b* using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132*b* using a suitable attachment or bonding process. In one embodiment, the bump material is reflowed by heating the material above its melting point to form spherical balls or bumps 146. In some applications, bumps 146 are reflowed a second time to improve electrical contact to conductive layer 132*b*. The bumps can also be compression bonded to conductive layer 132*b*. Bumps 146 represent one type of interconnect structure that can be formed over conductive layer 132*b*. The interconnect structure can also use bond wires, conductive paste, stud bump, micro bump, or other electrical interconnect.

Figure 3E:
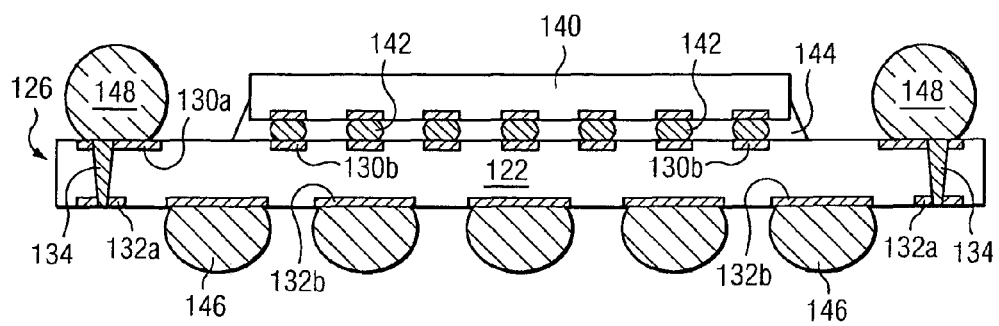

In FIG. 3*e*, an electrically conductive bump material is deposited over conductive layer 130*a* using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130*a* using a suitable attachment or bonding process. In one embodiment, the bump material is reflowed by heating the material above its melting point to form spherical balls or bumps 148. In some applications, bumps 148 are reflowed a second time to improve electrical contact to conductive layer 130*a*. The bumps can also be compression bonded to conductive layer 130*a*. Bumps 148 represent one type of interconnect structure that can be formed over conductive layer 130*a*. The interconnect structure can also use bond wires, conductive paste, stud bump, micro bump, or other electrical interconnect.

Figure 3F:
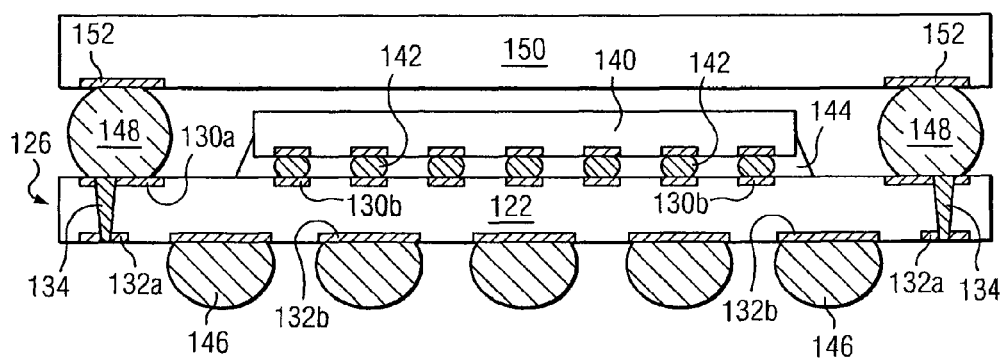

In FIG. 3*f*, a semiconductor die or package 150 is mounted over semiconductor die 140. Semiconductor die 150 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 150 may also contain IPDS, such as inductors, capacitors, and resistors, for RF signal processing. In one embodiment, semiconductor die 150 is a BGA, WLCSP, or other semiconductor package or component. Contact pads 152 on semiconductor die 150 are electrically connected to bumps 148, conductive layer 130*a*, TSVs 134, and conductive layer 132*a*.

Semiconductor die 140 and 150 stacked over WLCSP 126 constitute a PoP structure. Semiconductor wafer 120 is singulated with a saw blade or laser cutting tool into individual PoP structures. Conductive TSV 134 and bumps 142, 146, and 148 provide vertical, z-direction interconnect between the semiconductor devices of the PoP structure. Accordingly, the active and passive devices within semiconductor die 122, 140, and 150 are electrically connected through conductive layers 130 and 132, TSV 134, and bumps 142, 146, and 148.

Figure 4A:
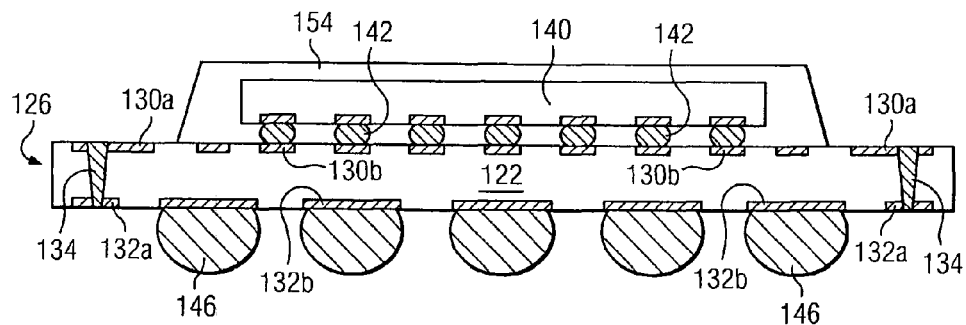
FIGS. 4a-4b illustrate a PoP structure with a flipchip die electrically interconnected through TSV in the WLCSP.
Figure 4B:
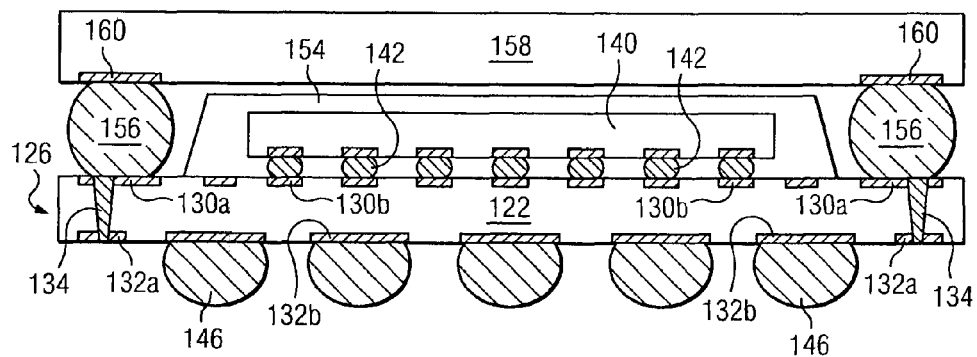

FIGS. 4a-4b show another PoP structure with a flipchip die electrically interconnected through the TSV in the WLCSP. Continuing with the structure described up to FIG. 3d, an encapsulant or molding compound 154 is deposited over WLSCP 126 and semiconductor die 140 using a paste printing, compressive molding, transfer molding, liquid encapsulant molding, vacuum lamination, spin coating, or other suitable applicator, as shown in FIG. 4a. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants.

In FIG. 4b, an electrically conductive bump material is deposited over conductive layer 130a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130a using a suitable attachment or bonding process. In one embodiment, the bump material is reflowed by heating the material above its melting point to form spherical balls or bumps 156. In some applications, bumps 156 are reflowed a second time to improve electrical contact to conductive layer 130a. The bumps can also be compression bonded to conductive layer 130a. Bumps 156 represent one type of interconnect structure that can be formed over conductive layer 130a. The interconnect structure can also use bond wires, conductive paste, stud bump, micro bump, or other electrical interconnect.

A semiconductor die or package 158 is mounted over semiconductor die 140. Semiconductor die 158 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 158 may also contain IPDS, such as inductors, capacitors, and resistors, for RF signal processing. In one embodiment, semiconductor die 158 is a BGA, WLCSP, or other semiconductor package or component. Contact pads 160 on semiconductor die 158 are electrically connected to bumps 156, conductive layer 130a, TSVs 134, and conductive layer 132a.

Semiconductor die 140 and 158 stacked over WLCSP 126 constitute a PoP structure. Semiconductor wafer 120 is singulated with a saw blade or laser cutting tool into individual PoP structures. Conductive TSV 134 and bumps 142, 146, and 156 provide vertical, z-direction interconnect between the semiconductor devices in the PoP structure. Accordingly, the active and passive devices within semiconductor die 122, 140, and 158 are electrically connected through conductive layers 130 and 132, TSV 134, and bumps 142, 146, and 156.

Figure 5A:
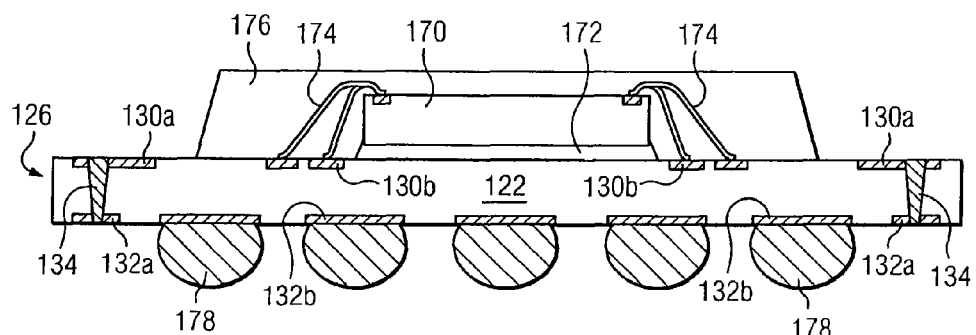
FIGS. 5a-5b illustrate a PoP structure with a wire bond die electrically interconnected through TSV in the WLCSP.
Figure 5B:
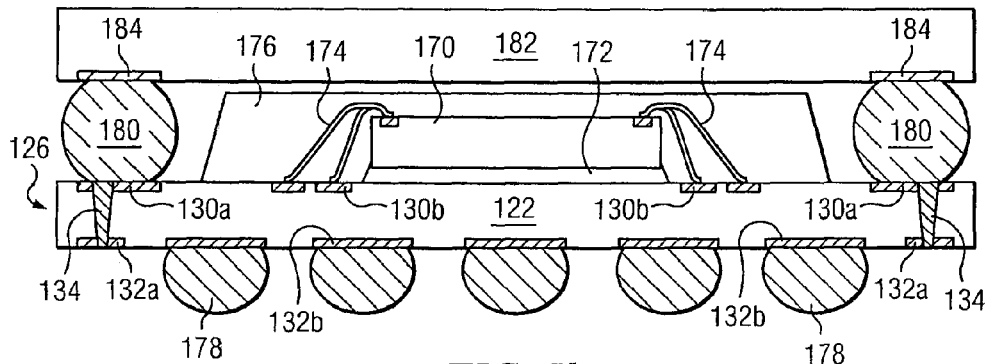

FIGS. 5a-5b show another PoP structure with a wire bond die electrically interconnected through the TSV in the WLCSP. Continuing with the structure described up to FIG. 3c, a semiconductor die or package 170 is mounted to the top surface of WLCSP 126 using die attach adhesive 172, as shown in FIG. 5a. Semiconductor die 170 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 170 may also contain IPDS, such as inductors, capacitors, and resistors, for RF signal processing. Semiconductor die 170 is electrically connected to conductive layer 130b using bond wires 174.

An encapsulant or molding compound 176 is deposited over WLSCP 126 and semiconductor die 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants.

An electrically conductive bump material is deposited over conductive layer 132b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132b using a suitable attachment or bonding process. In one embodiment, the bump material is reflowed by heating the material above its melting point to form spherical balls or bumps 178. In some applications, bumps 178 are reflowed a second time to improve electrical contact to conductive layer 132b. The bumps can also be compression bonded to conductive layer 132b. Bumps 178 represent one type of interconnect structure that can be formed over conductive layer 132b. The interconnect structure can also use bond wires, conductive paste, stud bump, micro bump, or other electrical interconnect.

In FIG. 5b, an electrically conductive bump material is deposited over conductive layer 130a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130a using a suitable attachment or bonding process. In one embodiment, the bump material is reflowed by heating the material above its melting point to form spherical balls or bumps 180. In some applications, bumps 180 are reflowed a second time to improve electrical contact to conductive layer 130a. The bumps can also be compression bonded to conductive layer 130a. Bumps 180 represent one type of interconnect structure that can be formed over conductive layer 130a. The interconnect structure can also use bond wires, conductive paste, stud bump, micro bump, or other electrical interconnect.

A semiconductor die or package 182 is mounted over semiconductor die 170. Semiconductor die 182 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 182 may also contain IPDS, such as inductors, capacitors, and resistors, for RF signal processing. In one embodiment, semiconductor die 182 is a BGA, WLCSP, or other semiconductor package or component. Contact pads 184 on semiconductor die 182 are electrically connected to bumps 180, conductive layer 130a, TSVs 134, and conductive layer 132a.

Semiconductor die 170 and 182 stacked over WLCSP 126 constitute a PoP structure. Semiconductor wafer 120 is singulated with a saw blade or laser cutting tool into individual PoP structures. Conductive TSV 134 and bumps 178 and 180 and bond wires 174 provide vertical, z-direction interconnect between the semiconductor devices in the PoP structure. Accordingly, the active and passive devices within semiconductor die 122, 170, and 182 are electrically connected through conductive layers 130 and 132, TSV 134, bond wires 174, and bumps 178 and 180.

Figure 6A:
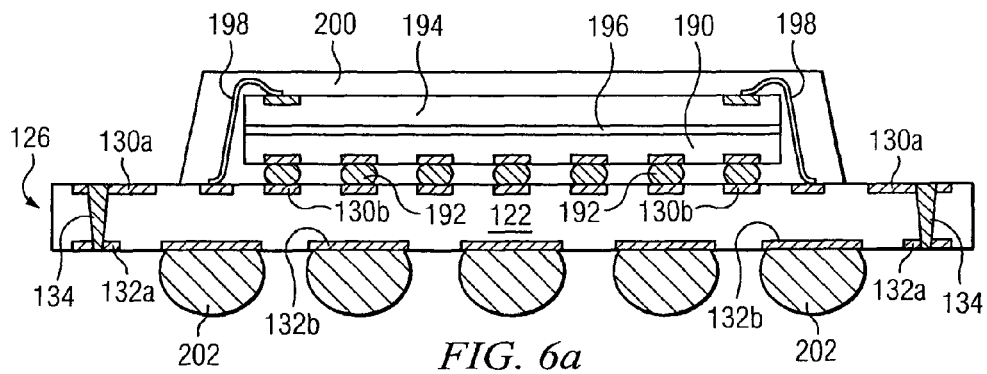
FIGS. 6a-6b illustrate a PoP structure with stacked wire bond die and flipchip die electrically interconnected through TSV in the WLCSP.
Figure 6B:
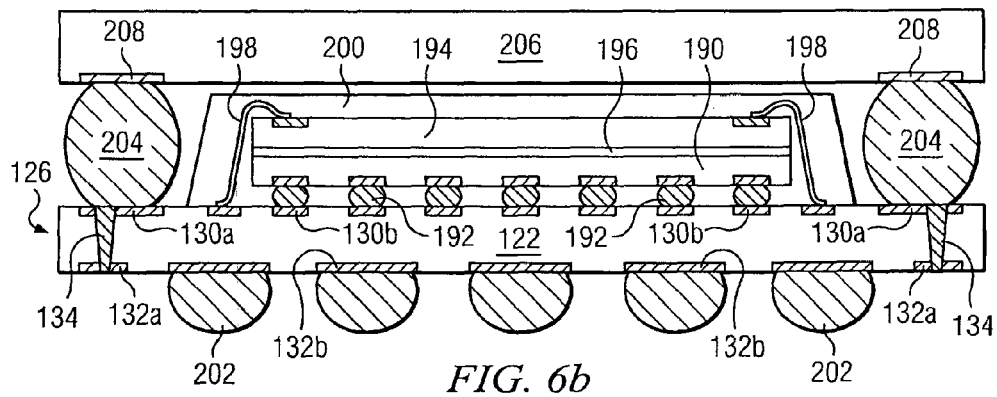

FIGS. 6a-6b show another PoP structure with stacked flipchip die and wire bond die electrically interconnected through the TSV in the WLCSP. Continuing with the structure described up to FIG. 3c, a semiconductor die or package 190 is mounted to the top surface of WLCSP 126 in a flipchip arrangement with bumps 192 electrically connected to conductive layer 130b, as shown in FIG. 6a. Semiconductor die 190 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 190 may also contain IPDS, such as inductors, capacitors, and resistors, for RF signal processing.

A semiconductor die or package 194 is mounted to the top surface of semiconductor die 190 using die attach adhesive 196. Semiconductor die 194 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 194 may also contain IPDS, such as inductors, capacitors, and resistors, for RF signal processing. Semiconductor die 194 is electrically connected to conductive layer 130b using bond wires 198.

An encapsulant or molding compound 200 is deposited over WLSCP 126 and semiconductor die 190 and 194 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive and environmentally protects the semiconductor device from external elements and contaminants.

An electrically conductive bump material is deposited over conductive layer 132b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132b using a suitable attachment or bonding process. In one embodiment, the bump material is reflowed by heating the material above its melting point to form spherical balls or bumps 202. In some applications, bumps 202 are reflowed a second time to improve electrical contact to conductive layer 132b. The bumps can also be compression bonded to conductive layer 132b. Bumps 202 represent one type of interconnect structure that can be formed over conductive layer 132b. The interconnect structure can also use bond wires, conductive paste, stud bump, micro bump, or other electrical interconnect.

In FIG. 6b, an electrically conductive bump material is deposited over conductive layer 130a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130a using a suitable attachment or bonding process. In one embodiment, the bump material is reflowed by heating the material above its melting point to form spherical balls or bumps 204. In some applications, bumps 204 are reflowed a second time to improve electrical contact to conductive layer 130a. The bumps can also be compression bonded to conductive layer 130a. Bumps 204 represent one type of interconnect structure that can be formed over conductive layer 130a. The interconnect structure can also use bond wires, conductive paste, stud bump, micro bump, or other electrical interconnect.

A semiconductor die or package 206 is mounted over semiconductor die 190 and 194. Semiconductor die 206 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 206 may also contain IPDS, such as inductors, capacitors, and resistors, for RF signal processing. In one embodiment, semiconductor die 206 is a BGA, WLCSP, or other semiconductor package or component. Contact pads 208 on semiconductor die 206 are electrically connected to bumps 204, conductive layer 130a, TSVs 134, and conductive layer 132a.

Semiconductor die 190, 194, and 206 stacked over WLCSP 126 constitute a PoP structure. Semiconductor wafer 120 is singulated with a saw blade or laser cutting tool into individual PoP structures. Conductive TSV 134 and bumps 202 and 204 and bond wires 198 provide vertical, z-direction interconnect between the semiconductor devices of the PoP structure. Accordingly, the active and passive devices within semiconductor die 122, 190, 194, and 206 are electrically connected through conductive layers 130 and 132, TSV 134, bond wires 198, and bumps 202 and 204.

Figure 7A:
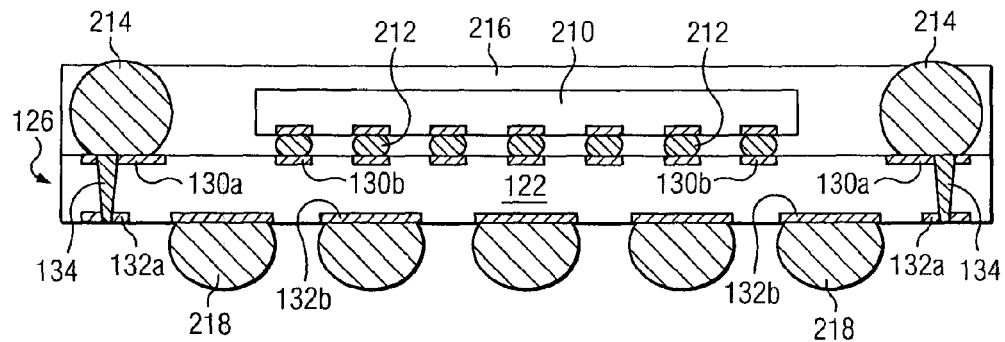
FIGS. 7a-7b illustrate a PoP structure with bump transposer electrically interconnected through TSV in the WLCSP.
Figure 7B:
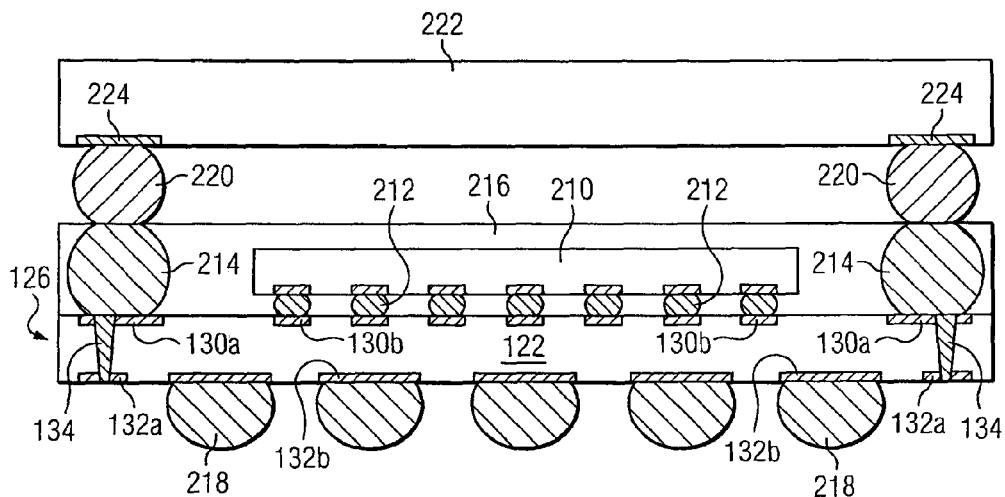

FIGS. 7a-7b show another PoP structure with bump transposer electrically interconnected through the TSV in the WLCSP. Continuing with the structure described up to FIG. 3c, a semiconductor die or package 210 is mounted to the top surface of WLCSP 126 in a flipchip arrangement with bumps 212 electrically connected to conductive layer 130b, as shown in FIG. 7a. Semiconductor die 210 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 210 may also contain IPDS, such as inductors, capacitors, and resistors, for RF signal processing.

An electrically conductive bump material is deposited over conductive layer 130a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130a using a suitable attachment or bonding process. In one embodiment, the bump material is reflowed by heating the material above its melting point to form spherical balls or bumps 214. In some applications, bumps 214 are reflowed a second time to improve electrical contact to conductive layer 130a. The bumps can also be compression bonded to conductive layer 130a. Bumps 214 represent one type of interconnect structure that can be formed over conductive layer 130a. The interconnect structure can also use bond wires, conductive paste, stud bump, micro bump, or other electrical interconnect.

An encapsulant or molding compound 216 is deposited over WLSCP 126 and semiconductor die 210 using a paste printing, compressive molding, transfer molding, liquid encapsulant molding, vacuum lamination, spin coating, or other suitable applicator. Encapsulant 216 can be polymer composite material, such as epoxy resin with filler, epoxy acrylate with filler, or polymer with proper filler. Encapsulant 216 is non-conductive and environmentally protects the semiconductor device from external elements and contaminants. A portion of the top surface of encapsulant 216 is removed by an etching process to expose bumps 214.

An electrically conductive bump material is deposited over conductive layer 132b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132b using a suitable attachment or bonding process. In one embodiment, the bump material is reflowed by heating the material above its melting point to form spherical balls or bumps 218. In some applications, bumps 218 are reflowed a second time to improve electrical contact to conductive layer 132b. The bumps can also be compression bonded to conductive layer 132b. Bumps 218 represent one type of interconnect structure that can be formed over conductive layer 132b. The interconnect structure can also use bond wires, conductive paste, stud bump, micro bump, or other electrical interconnect.

In FIG. 7b, an electrically conductive bump material is deposited over bumps 214 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 214 using a suitable attachment or bonding process. In one embodiment, the bump material is reflowed by heating the material above its melting point to form spherical balls or bumps 220. In some applications, bumps 220 are reflowed a second time to improve electrical contact to bumps 214. The bumps can also be compression bonded to bumps 214. Bumps 220 represent one type of interconnect structure that can be formed over bumps 214. The interconnect structure can also use bond wires, conductive paste, stud bump, micro bump, or other electrical interconnect.

A semiconductor die or package 222 is mounted over semiconductor die 210. Semiconductor die 222 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 222 may also contain IPDS, such as inductors, capacitors, and resistors, for RF signal processing. In one embodiment, semiconductor die 222 is a BGA, WLCSP, or other semiconductor package or component. Contact pads 224 on semiconductor die 222 are electrically connected to bumps 214 and 220, conductive layer 130a, TSVs 134, and conductive layer 132a.

Semiconductor die 210 and 222 stacked over WLCSP 126 constitute a PoP structure. Semiconductor wafer 120 is singulated with a saw blade or laser cutting tool into individual PoP structures. Conductive TSV 134 and bumps 214, 218, and 220 provide vertical, z-direction interconnect between the semiconductor devices in the PoP structure. Accordingly, the active and passive devices within semiconductor die 122, 210, and 222 are electrically connected through conductive layers 130 and 132, TSV 134, and bumps 214, 218, and 220.

Figure 8A:
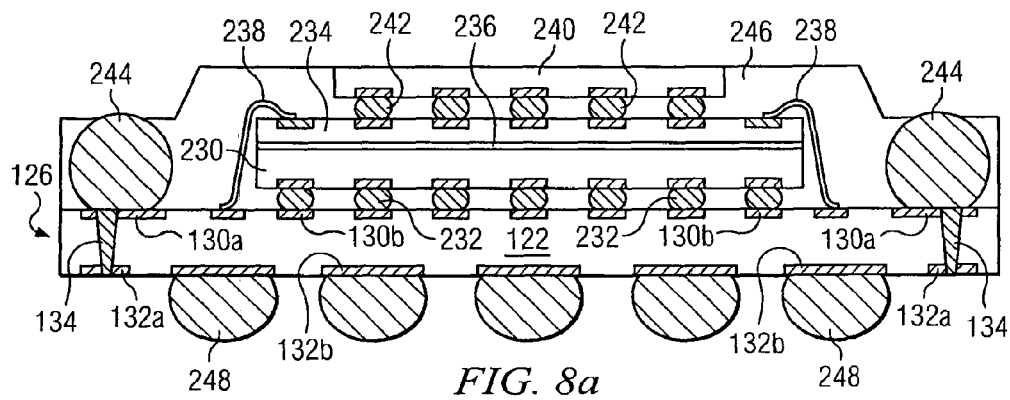
FIGS. 8a-8b illustrate a PoP structure with wire bond die and flipchip die and bump transposer electrically interconnected through TSV in the WLCSP.
Figure 8B:
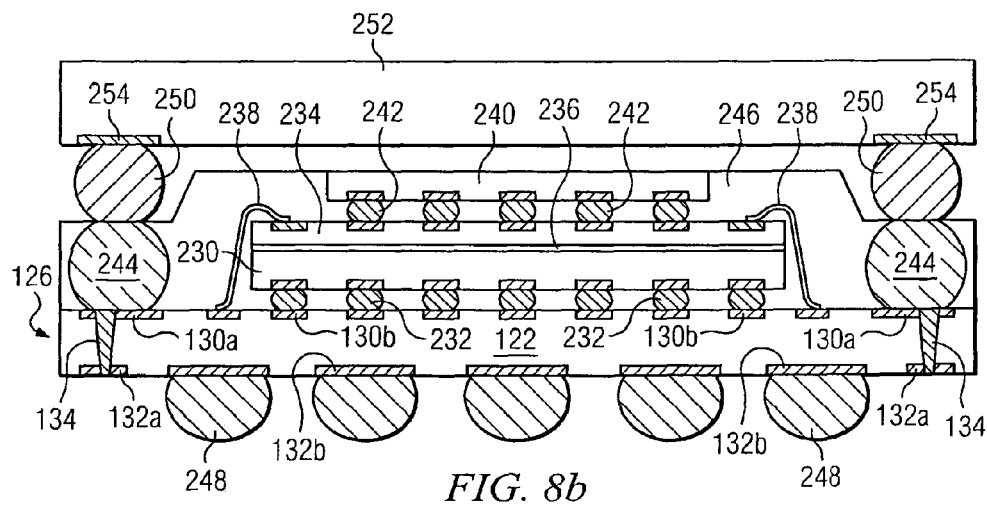

FIGS. 8a-8b show another PoP structure with flipchip die and wire bond die and bump transposer electrically interconnected through the TSV in the WLCSP. Continuing with the structure described up to FIG. 3c, a semiconductor die or package 230 is mounted to the top surface of WLCSP 126 in a flipchip arrangement with bumps 232 electrically connected to conductive layer 130b, as shown in FIG. 8a. Semiconductor die 230 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit.

Semiconductor die 230 may also contain IPDS, such as inductors, capacitors, and resistors, for RF signal processing.

A semiconductor die or package 234 is mounted to the top surface of semiconductor die 230 using die attach adhesive 236. Semiconductor die 234 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 234 may also contain IPDS, such as inductors, capacitors, and resistors, for RF signal processing. Semiconductor die 234 is electrically connected to conductive layer 130b using bond wires 238.

A semiconductor die or package 240 is mounted to the top surface of semiconductor die 234 in a flipchip arrangement with bumps 242 electrically connected to contact pads on semiconductor die 234. Semiconductor die 240 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 240 may also contain IPDS, such as inductors, capacitors, and resistors, for RF signal processing.

An electrically conductive bump material is deposited over conductive layer 130a using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130a using a suitable attachment or bonding process. In one embodiment, the bump material is reflowed by heating the material above its melting point to form spherical balls or bumps 244. In some applications, bumps 244 are reflowed a second time to improve electrical contact to conductive layer 130a. The bumps can also be compression bonded to conductive layer 130a. Bumps 244 represent one type of interconnect structure that can be formed over conductive layer 130a. The interconnect structure can also use bond wires, conductive paste, stud bump, micro bump, or other electrical interconnect.

An encapsulant or molding compound 246 is deposited over WLSCP 126, semiconductor die 230, 234, and 240, and bumps 244 using a paste printing, compressive molding, transfer molding, liquid encapsulant molding, vacuum lamination, spin coating, or other suitable applicator. Encapsulant 246 can be polymer composite material, such as epoxy resin with filler, epoxy acrylate with filler, or polymer with proper filler. Encapsulant 246 is non-conductive and environmentally protects the semiconductor device from external elements and contaminants. A portion of encapsulant 246 is removed by an etching process to expose bumps 244 and a back surface of semiconductor die 240.

An electrically conductive bump material is deposited over conductive layer 132b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132b using a suitable attachment or bonding process. In one embodiment, the bump material is reflowed by heating the material above its melting point to form spherical balls or bumps 248. In some applications, bumps 248 are reflowed a second time to improve electrical contact to conductive layer 132b. The bumps can also be compression bonded to conductive layer 132b. Bumps 248 represent one type of interconnect structure that can be formed over conductive layer 132b. The interconnect structure can also use bond wires, conductive paste, stud bump, micro bump, or other electrical interconnect.

In FIG. 8b, an electrically conductive bump material is deposited over bumps 244 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 244 using a suitable attachment or bonding process. In one embodiment, the bump material is reflowed by heating the material above its melting point to form spherical balls or bumps 250. In some applications, bumps 250 are reflowed a second time to improve electrical contact to bumps 244. The bumps can also be compression bonded to bumps 244.

A semiconductor die or package 252 is mounted over semiconductor die 230, 234, and 240. Semiconductor die 252 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 252 may also contain IPDS, such as inductors, capacitors, and resistors, for RF signal processing. In one embodiment, semiconductor die 252 is a BGA, WLCSP, or other semiconductor package or component. Contact pads 254 on semiconductor die 252 are electrically connected to bumps 244 and 250, conductive layer 130a, TSVs 134, and conductive layer 132a.

Semiconductor die 230, 234, 240, and 252 stacked over WLCSP 126 constitute a PoP structure. Semiconductor wafer 120 is singulated with a saw blade or laser cutting tool into individual PoP structures. Conductive TSV 134 and bumps 232, 242, 244, 248, and 250 and bond wires 238 provide vertical, z-direction interconnect between the semiconductor devices in the PoP structure. Accordingly, the active and passive devices within semiconductor die 122, 230, 234, 240, and 252 are electrically connected through conductive layers 130 and 132, TSV 134, and bumps 232, 242, 244, 248, and 250, and bond wires 238.

Figure 9A:
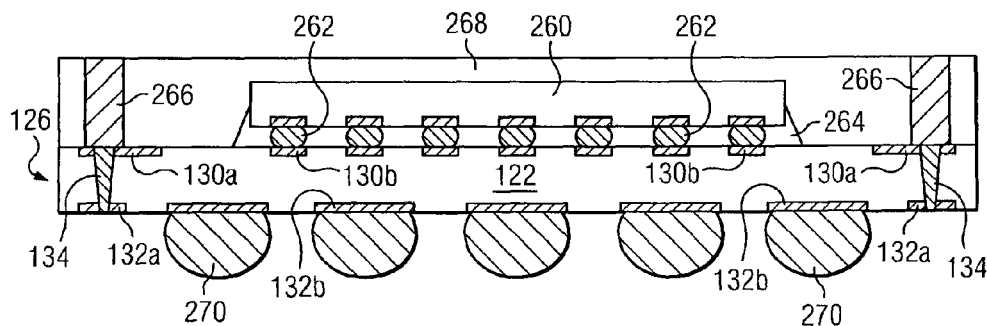
FIGS. 9a-9b illustrate a PoP structure with conductive pillar transposer electrically interconnected through TSV in the WLCSP.
Figure 9B:
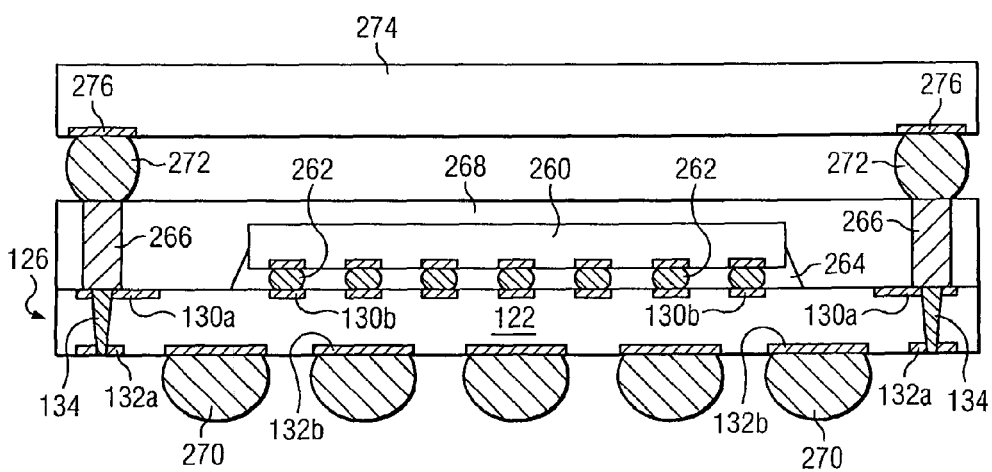

FIGS. 9a-9b show another PoP structure with conductive pillar transposer electrically interconnected through the TSV in the WLCSP. Continuing with the structure described up to FIG. 3c, a semiconductor die or package 260 is mounted to the top surface of WLCSP 126 in a flipchip arrangement with bumps 262 electrically connected to conductive layer 130b, as shown in FIG. 9a. Semiconductor die 260 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 260 may also contain IPDS, such as inductors, capacitors, and resistors, for RF signal processing. An underfill material 264, such as epoxy resin, is deposited under semiconductor die 260.

An encapsulant or molding compound 268 is deposited over WLCSP 126 and semiconductor die 260 using a paste printing, compressive molding, transfer molding, liquid encapsulant molding, vacuum lamination, spin coating, or other suitable applicator. Encapsulant 268 can be polymer composite material, such as epoxy resin with filler, epoxy acrylate with filler, or polymer with proper filler. Encapsulant 268 is non-conductive and environmentally protects the semiconductor device from external elements and contaminants.

A plurality of vias is formed in encapsulant 268 over contact pads 130a using laser drilling, mechanical drilling, or DRIE. The vias are filled with Cu, Al, tungsten (W), Au, solder, or other suitable electrically conductive material using electrolytic plating, electroless plating process, or other suitable metal deposition process to form conductive pillars 266. Conductive pillars 266 have a height ranging from 2-120 micrometers (μm). In another embodiment, conductive pillars 266 can be formed as stud bumps or stacked bumps.

An electrically conductive bump material is deposited over conductive layer 132b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132b using a suitable attachment or bonding process. In one embodiment, the bump material is reflowed by heating the material above its melting point to form spherical balls or bumps 270. In some applications, bumps 270 are reflowed a second time to improve electrical contact to conductive layer 132b. The bumps can also be compression bonded to conductive layer 132b. Bumps 270 represent one type of interconnect structure that can be formed over conductive layer 132b. The interconnect structure can also use bond wires, conductive paste, stud bump, micro bump, or other electrical interconnect.

In FIG. 9b, an electrically conductive bump material is deposited over conductive pillars 266 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 266 using a suitable attachment or bonding process. In one embodiment, the bump material is reflowed by heating the material above its melting point to form spherical balls or bumps 272. In some applications, bumps 272 are reflowed a second time to improve electrical contact to conductive pillars 266. The bumps can also be compression bonded to conductive pillars 266. Bumps 272 represent one type of interconnect structure that can be formed over conductive pillars 266. The interconnect structure can also use bond wires, conductive paste, stud bump, micro bump, or other electrical interconnect.

A semiconductor die or package 274 is mounted over semiconductor die 260. Semiconductor die 274 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 274 may also contain IPDS, such as inductors, capacitors, and resistors, for RF signal processing. In one embodiment, semiconductor die 274 is a BGA, WLCSP, or other semiconductor package or component. Contact pads 276 on semiconductor die 274 are electrically connected to bumps 272, conductive pillars 266, conductive layer 130a, TSVs 134, and conductive layer 132a.

Semiconductor die 260 and 274 stacked over WLCSP 126 constitute a PoP structure. Semiconductor wafer 120 is singulated with a saw blade or laser cutting tool into individual PoP structures. Conductive TSV 134 and bumps 262, 270, and 272 and conductive pillars 266 provide vertical, z-direction interconnect between the semiconductor devices of the PoP structure. Accordingly, the active and passive devices within semiconductor die 122, 260, and 274 are electrically connected through conductive layers 130 and 132, TSV 134, and bumps 262, 270, and 274, and conductive pillars 266.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of semiconductor die;
   forming a first conductive layer over an active surface of the semiconductor die including active devices;
   forming a second conductive layer over a second surface of the semiconductor die opposite the active surface of the semiconductor die such that each semiconductor die constitutes a wafer level chip scale package (WLCSP);
   forming a conductive through silicon via (TSV) through the active surface of the WLCSP;
   mounting a first semiconductor component to the WLCSP;
   electrically connecting the first semiconductor component to the first conductive layer;
   forming a first bump over the first conductive layer;
   mounting a second semiconductor component to the first bump and electrically connecting the second semiconductor component to the first semiconductor component and WLCSP through the first bump and TSV; and
   singulating the semiconductor wafer after mounting the second semiconductor component.

2. The method of claim 1, further including depositing an encapsulant over the first bump and first semiconductor component.

3. The method of claim 2, further including removing a portion of the encapsulant to expose the first bump.

4. The method of claim 1, wherein the first semiconductor component is electrically connected to the first conductive layer by bond wire or bump.

5. The method of claim 1, further including forming a second bump over the second conductive layer.

6. The method of claim 1, further including mounting a third semiconductor component to the first semiconductor component.

7. The method of claim 6, further including mounting a fourth semiconductor component to the third semiconductor component.

8. A method of making a semiconductor device, comprising:
   providing a semiconductor wafer including a plurality of semiconductor die;
   forming a first conductive layer over an active surface of the semiconductor die, each semiconductor die constituting a wafer level chip scale package (WLCSP);
   forming a conductive through silicon via (TSV) through the WLCSP;
   mounting a first semiconductor component to the WLCSP;
   forming a first interconnect structure over the first conductive layer;
   mounting a second semiconductor component to the first interconnect structure and electrically connecting the second semiconductor component to the first semiconductor component and WLCSP through the first interconnect structure and TSV; and
   singulating the semiconductor wafer after mounting the second semiconductor component.

9. The method of claim 8, further including depositing an encapsulant over the first interconnect structure and first semiconductor component.

10. The method of claim 9, further including removing a portion of the encapsulant to expose the first interconnect structure.

11. The method of claim 8, wherein the first interconnect structure includes a bump or pillar.

12. The method of claim 8, further including electrically connecting the first semiconductor component to the first conductive layer by bond wire or bump.

13. The method of claim 8, further including:
   forming a second conductive layer over a second surface of the semiconductor die opposite the active surface of the semiconductor die; and
   forming a second interconnect structure over the second conductive layer.

14. The method of claim 8, further including:
   mounting a third semiconductor component to the first semiconductor component; and
   mounting a fourth semiconductor component to the third semiconductor component.

15. The method of claim 1, further including depositing an encapsulant over the first semiconductor component.

16. The method of claim 8, further including depositing an encapsulant over the first semiconductor component.

17. The method of claim 8, further including mounting a third semiconductor component to the first semiconductor component.

* * * * *